United States Patent
Yamanaka et al.

(10) Patent No.: US 9,017,477 B2
(45) Date of Patent: Apr. 28, 2015

(54) PROCESS FOR PRODUCING COLLOIDAL CRYSTAL AND COLLOIDAL CRYSTAL

(75) Inventors: Junpei Yamanaka, Nagoya (JP); Mariko Shinohara, Nagoya (JP); Akiko Toyotama, Nagoya (JP); Koki Yoshizawa, Nagoya (JP); Sachiko Onda, Nagoya (JP); Masakatsu Yonese, Nagoya (JP); Fumio Uchida, Osaka (JP)

(73) Assignees: Nagoya City University, Nagoya-Shi (JP); Fuji Chemical Co., Ltd., Osaka-Shi (JP)

( * ) Notice: Subject to any disclaimer, the term of this patent is extended or adjusted under 35 U.S.C. 154(b) by 1186 days.

(21) Appl. No.: 12/994,087

(22) PCT Filed: Apr. 30, 2009

(86) PCT No.: PCT/JP2009/058500
§ 371 (c)(1),
(2), (4) Date: Dec. 29, 2010

(87) PCT Pub. No.: WO2009/145031
PCT Pub. Date: Dec. 3, 2009

(65) Prior Publication Data
US 2011/0123803 A1 May 26, 2011

(30) Foreign Application Priority Data
May 28, 2008 (JP) ................. 2008-140089

(51) Int. Cl.
*C30B 7/14* (2006.01)
*C30B 5/00* (2006.01)
(Continued)

(52) U.S. Cl.
CPC . *C30B 5/00* (2013.01); *C01B 33/14* (2013.01); *C01B 33/157* (2013.01); *C01B 33/18* (2013.01)

(58) Field of Classification Search
USPC ......................... 117/68, 81, 82, 83
See application file for complete search history.

(56) References Cited

U.S. PATENT DOCUMENTS

| | | | | |
|---|---|---|---|---|
| 3,647,401 A | * | 3/1972 | Meadows | 75/229 |
| 4,803,688 A | * | 2/1989 | Lawandy | 372/21 |
| 5,232,913 A | * | 8/1993 | Ohmori et al. | 514/21.9 |

FOREIGN PATENT DOCUMENTS

| | | |
|---|---|---|
| JP | 11-319539 A | 11/1999 |
| JP | 2001-79384 A | 3/2001 |

(Continued)

OTHER PUBLICATIONS

Ackerson et al., "Shear-Induced Partial Translational Ordering of a Colloidal Solid", Physical Review A, vol. 30, No. 2, Aug. 1984, pp. 906-919.

(Continued)

*Primary Examiner* — Bob M Kunemund
(74) *Attorney, Agent, or Firm* — Birch, Stewart, Kolasch & Birch, LLP

(57) ABSTRACT

Provided is a process for producing colloidal crystals from which a large single crystal reduced in lattice defects and unevenness can be easily produced at low cost without fail. The process for colloidal crystal production comprises: preparing a colloidal polycrystal dispersion in which colloidal crystals precipitate at a given temperature (preparation step); introducing into a vessel The colloidal polycrystal dispersion in the state of containing fine colloidal polycrystals precipitated (introduction step); and melting the colloidal polycrystals and then recrystallizing the molten polycrystals (recrystallization step). The crystals thus obtained have fewer lattice defects and less unevenness than the original polycrystals.

7 Claims, 12 Drawing Sheets

(51) Int. Cl.
*C01B 33/14* (2006.01)
*C01B 33/157* (2006.01)
*C01B 33/18* (2006.01)

(56) References Cited

FOREIGN PATENT DOCUMENTS

JP 2004-89996 A 3/2004
JP 2008-93654 A 4/2008

OTHER PUBLICATIONS

Palberg et al., "Grain Size Control in Polycrystalline Colloidal Solids", J. Chem. Phys., vol. 102, No. 12, Mar. 22, 1995, pp. 5082-5087.
Shinohara et al., Book of Abstracts, 60th Divisional Meeting on Colloid and Interface Chemistry, "Melting of Colloidal Silica Crystals Due to Unidirectional Cooling", Sep. 19-23, 2007, 2nd Japan-Australia Symposium, pp. 402.
Wakabayashi et al., "Three-Dimensional Centimeter-Sized Colloidal Silica Crystals Formed by Addition of Base", Langmuir, 2006, vol. 22, No. 18, pp. 7936-7941.
Weissman et al., "Thermally Switchable Periodicities and Diffraction from Mesoscopically Ordered Materials", Science, vol. 274, Nov. 8, 1996, pp. 959-960.
Yamanaka et al., "One-Directional Crystal Growth in Charged Colloidal Silica Dispersons Driven by Diffusion of Base", J. of the Amer. Chem. Soc., vol. 126, No. 23, 2004, pp. 7156-7157.
Extended European Search Report issued on Jul. 13, 2011 in corresponding European Patent Application No. 09 75 4539.
Harada et al., "Optically induced melting of colloidal crystals and their recrystallization," Colloids and Surfaces B: Biointerfaces, vol. 56, pp. 220-223, 2007.

* cited by examiner

Before recrystallization

↓

After recrystallization

| | ν (mm/分) | Crystal Size | Externals of crystal |
|---|---|---|---|
| Example 1-4 | 42 | 0.5~1 | |
| Example 1-3 | 30 | 1~3 | |
| Example 1-2 | 18 | 10<　the mm size crystal exists together. | |
| Example 1-1 | 2 | 10< | | re-crystallization region

PROCESS FOR PRODUCING COLLOIDAL CRYSTAL AND COLLOIDAL CRYSTAL

TECHNICAL FIELD

The present invention belongs to a colloidal technical field. In particular, the present invention relates to a process for producing colloidal crystals using a colloidal polycrystal dispersion crystallized by a change in temperature and to colloidal crystals produced using the process.

BACKGROUND ART

Colloid means a state where colloidal particles having a size of several nm to several μm are dispersed in a medium, and has a broad industrial application in fields such as paints and medical supplies.

When a suitable condition is selected, the colloidal particles are regularly disposed in a colloidal dispersion and form a structure referred to as a "colloidal crystal". There are two types of the colloidal crystal. The first type is a crystal formed on a condition that a particle volume fraction is about 0.5 (a concentration=50% by volume) or more in a colloidal system (hard sphere system) having no particular interaction between particles. This is similar to a phenomenon that when macroscopic balls are stuffed into a restricted space, the balls are regularly disposed. The second type is a crystal structure formed by an electrostatic interaction acting between particles in a dispersion system (charged colloidal system) of charged colloidal particles. For example, the crystal is formed by a colloidal system obtained by dispersing silica particles ($SiO_2$) and other particles made of a polymer (polystyrene, poly (methyl methacrylate), or the like) having a surface having a dissociable group into a polar medium such as water. Since the electrostatic interaction extends to a long distance, a crystal can be produced even when a particle concentration is low (a distance between particles is long) or a particle volume fraction is about 0.001.

Similarly to usual crystals, the colloidal crystals show the Bragg diffraction electromagnetic waves. The diffraction wavelength can be set to a visible light range by selecting production conditions (a particle concentration and a particle diameter). Consequently, application development to an optical element or the like including a photonic material has been actively considered both nationally and internationally. The present mainstream of a producing process of an optical material includes a multilayer thin film process and a lithography process. Both of the techniques have excellent periodic accuracy. However, the former provides only a one-dimensional periodic structure, and the latter provides only the one-dimensional periodic structure or a two-dimensional periodic structure. A three-dimensional crystal structure (opal structure) obtained by precipitation of fine particles has a plane distance having good evenness when particles having a uniform particle diameter are used. However, an area having good single crystallinity is limited to about ten periods. It is difficult for a process for precipitating fine particles to construct a macroscopic three-dimensional structure (that is, a large colloidal single crystal).

Usually, the colloidal crystals are obtained as polycrystal bodies in which about 1 mm microcrystals assemble together. However, when the colloidal crystals are used as the optical element, a single crystal of cm order is often required. Various lattice defects and unevenness usually exist in the colloidal crystals. This may obstruct the use of the colloidal crystals as the optical element. As described above, establishment of a process for producing colloidal crystals has been required, which (1) has high quality (that is, free from lattice defects and unevenness as much as possible) and (2) can produce a large single crystal.

As a technique of controlling generation of colloidal crystals derived from charged colloidal system, hitherto, a technique (Non-Patent Document 1) and a process (Non-Patent Document 2) have been reported hitherto. The technique (Non-Patent Document 1) obtains a single crystal by shearing orientation of charged colloidal polycrystals to an ionic polymer latex/water dispersion system in a region between parallel plates, the region having a gap of about 0.1 mm. The process (Non-Patent Document 2) applies an electric field for crystallization. However, these processes have drawbacks: for example, a special device for applying a shear field is required in the former case, and crystallization is hindered due to impurity ions produced by an electrode reaction in the latter case. In addition, there is a report (Non-Patent Document 3) in which charged colloidal crystals are solidified by a polymer gel, and a distance of crystal planes is controlled using a change in gel volume caused by a change in temperature. However, this requires a complicated process, and no attempt to generate a crystal from an unregulated particle disposal state has been made.

The present inventors have developed a producing process of colloidal crystals for making a specific ionization material coexist in a charged colloidal dispersion system to form the colloidal crystals by a change in temperature (Patent Document 1). The process can produce the colloidal crystals comparatively easily without requiring a particular device and a complicated process from various kinds of charged colloidal systems. However, it is difficult for the process to produce a large-sized single crystal exceeding 1 cm.

The present inventors have succeeded in producing the largest colloidal crystals in the world such as columnar crystals having a length of several cm and cubic crystals having one side of about 1 cm, using a novel technique of diffusing a base from one end of a sample as the process for producing colloidal crystals capable of obtaining the large-sized single crystal. In the technique, the inventors have used a silica colloidal particles/water system in which charge number is increased with pH to be crystallized (Non-Patent Document 4, Patent Document 2). However, the process has a fault that it takes an extremely long time to grow crystals. It was found by spectrometry that large unevenness (inclination and fluctuation) exist in the lattice spacing of the large-sized crystals thus obtained. This is considered to be caused by time/spatial unevenness of a base concentration and disorder of diffuse or the like essential to a diffuse phenomenon. The unevenness of the plane distance is decreased with time. However, even if the base concentration is approximately uniform, distribution of about 10% exists in the plane distance. Consequently, the application is limited as the optical element.

Consequently, the present inventors have conducted earnest studies to develop a process for producing colloidal crystals, which can easily and inexpensively produce a large-sized single crystal having fewer lattice defects and less unevenness (Patent Document 3). In the process, a colloidal dispersion in which pyridine is added to silica colloid is prepared. A degree of dissociation of pyridine changes depending on a temperature. When the higher the temperature of the colloidal dispersion is, the larger the charge density of the silica particles is, and thereby, the colloidal dispersion has a character in which the colloidal crystals form. The colloidal dispersion is put into a vessel in a state where the colloidal crystals do not form. A temperature of one end side of the vessel is locally set to a temperature at which the colloidal crystals form by warming. A range set to the temperature at which the colloidal crystals form is gradually expanded to grow the colloidal crystals. The colloidal crystals thus obtained are changed to an extremely large single crystal that has fewer lattice defects and less unevenness. Consequently, a half-value width in an absorption spectrum and a reflection spectrum can be set to an extremely narrow range of 20 nm or less. Space unevenness of diffraction wavelength having extremely high quality of 2.0% or less can be obtained. Herein, the space unevenness is obtained by denoting by percentage a value obtained by dividing standard deviation of spatial distribution of the diffraction wavelength of the colloidal crystals measured by reflective spectroscopy or transmission spectroscopy by weighted average efficiency of the diffraction wavelength (hereafter the same)

Non-Patent Document 1: B. J. Ackerson and N. A. Clark, Phys. Rev. A 30, 906, (1984)
Non-Patent Document 2: T. Palberg, W. Moench, J. Schwarz and P. Leiderer, J. Chem. Phys. 102, 5082, (1995)
Non-Patent Document 3: J. M. Weissman, H. B. Sunkara, A. S. Tse and S. A. Asher, Science, 274, 959, (1996)
Non-Patent Document 4: N. Wakabayashi, J. Yamanaka, M. Murai, K. Ito, T. Sawada, and M. Yonese Langmuir, 22, 7936-7941, (2006)
Patent Document 1: Japanese Patent Application Laid-Open No. 11-319539
Patent Document 2: Japanese Patent Application Laid-Open No. 2004-89996
Patent Document 3: Japanese Patent Application Laid-Open No. 2008-93654

DISCLOSURE OF THE INVENTION

Problems to be Solved by the Invention

In the process for producing the colloidal crystals described in the patent document 3, the temperature at which the colloidal crystals form from the colloidal dispersion is changed depending on not only the concentration of pyridine but also slight ionic impurities. Therefore, there has been a problem that it is necessary to pay meticulous attention to purity of a chemical and a solvent, cleaning of the vessel, or the like in order to form the colloidal crystals with high reproducibility. The present invention has been made in view of the conventional actual condition. It is an object of the present invention to provide a process for producing colloidal crystals, wherein large colloidal crystals having fewer lattice defects and less unevenness can be easily produced at low cost without fail.

Means for Solving the Problems

A process for producing colloidal crystals of the present invention includes: a preparation step of preparing a colloidal polycrystal dispersion in which colloidal polycrystals melt at a given temperature; an introduction step of introducing the colloidal polycrystal dispersion into a vessel; and a recrystallization step of recrystallizing the colloidal polycrystals, by setting a temperature of a partial area or a whole area of the colloidal polycrystal dispersion in the vessel to a temperature at which the colloidal crystals do not form and thereafter changing the temperature to a temperature at which the colloid recrystallize.

In the process for producing the colloidal crystals of the present invention, in the preparation step, the colloidal polycrystal dispersion in which the colloidal polycrystals melt at a given temperature is first prepared. In the introduction step, the colloidal polycrystal dispersion in which the the colloid recrystallize is introduced into the vessel. Furthermore, in the recrystallization step, the temperature of the partial area or the whole area of the colloidal polycrystal dispersion in the vessel is set to the temperature at which the colloidal crystals do not form, and the temperature is then changed to the temperature at which the colloid recrystallize. That is, since the colloidal polycrystal dispersion in which the colloidal polycrystals has formed previously melt and then recrystallized, the colloidal polycrystals can be formed without fail. Consequently, the colloidal crystals can be formed with high reproducibility without paying much attention to purity of a chemical and a solvent, and cleaning of the vessel, or the like. According to the inventors' test results, the colloidal crystals thus obtained are changed to an extremely large single crystal. In addition, the colloidal crystals have fewer lattice defects and less unevenness.

Therefore, the process for producing colloidal crystals of the present invention can easily produce large colloidal crystals having fewer lattice defects and less unevenness at low cost without fail.

In the process for producing the colloidal crystals of the present invention, a temperature adjusting means can set a temperature of a part of the colloidal polycrystal dispersion to a temperature at which the colloidal crystals melt, in the recrystallization step, to form a melting area, and the colloidal crystals can be recrystallized by a zone melting process for moving the melting area. The process can easily produce a gigantic colloidal single crystal. Furthermore, the process has an effect of preventing impurity colloidal particles from entering into the colloidal single crystal when the impurity colloidal particles exist in the colloidal polycrystal dispersion.

Herein, the melting area can be moved by a moving means enabling relative movement between the temperature adjusting means and the vessel. The movement of the melting area reduces a relative moving speed of the melting area to slow down recrystallization from a melt state to a crystal state, thereby enlarging a single crystal. The movement increases the relative moving speed of the melting area to rapidly produce the single crystal, thereby easily controlling recrystallization. Consequently, a balance between the quality and efficiency of production of the colloidal crystals can be achieved in accordance with an object.

The melting area may be moved by moving the vessel, by moving the temperature adjusting means, or by moving both the vessel and the temperature adjusting means.

The moving speed of the melting area may be suitably selected according to the composition of the colloidal polycrystal dispersion, the temperature of the melting area, or the like. However, usually, the moving speed is preferably 10 mm/min or less, and more preferably 2 mm/min or less. This is because the excessively fast moving speed of the melting area complicates the formation of the large colloidal single crystal.

The colloidal polycrystal dispersion is preferably filled between two walls facing each other approximately in parallel in the introduction step. Since this hardly causes the generation of a free convective flow in the vessel, the growth of the colloidal crystals is hardly disturbed. Therefore, a larger single crystal having fewer lattice defects and less unevenness can be produced. In this case, the temperature of a colloidal dispersion system may be changed in a direction parallel to the wall or in direction perpendicular to the wall. Even if highly viscous liquids such as ethylene glycol and glycerin are used as a colloidal dispersion medium, the convective flow is hardly generated, and thereby the same effect is obtained.

Examples of a process for producing the colloidal polycrystal dispersion in which the colloidal polycrystals melt at a given temperature include adding a weak acid or a weak base whose degree of dissociation changes depending on a change in temperature. For example, the degree of dissociation of pyridine as the weak base is increased with temperature rising ($pK_b$ value of a non-salt aqueous solution of pyridine determined by electrical conductivity measurement is 9.28 at 10° C. and 8.53 at 50° C., and is linearly decreased with a temperature). Therefore, when pyridine is made to coexist in a colloidal dispersion system such as a silica colloidal dispersion system, an effective surface charge density $\sigma_e$ value of the colloidal particles is believed to be increased with temperature rising. In addition, the dissociation at various temperatures will be in an equilibrium condition in a time much shorter than a time required for a change in temperature of the system in the normal use condition. That is, the $\sigma_e$ value is primarily decided by a sample temperature, and does not depend on the previous temperature history or the like. Thereby, the melting and the recrystallization of the colloidal polycrystal dispersion are thermally reversibly generated.

Hereinafter, the weak base, the weak acid, and the salt whose degrees of dissociation change depending on the change in temperature are exemplified, but not limited thereto. Preferable examples of the weak base include pyridine and a pyridine derivative (monomethylpyridine, dimethylpyridine, trimethylpyridine, or the like). The degree of dissociation thereof is increased with a temperature increase. Since pyridine or the pyridine derivative has a suitable $pK_b$ value for crystallization of silica particles and has a sufficiently large change in the $pK_b$ value according to a temperature, pyridine or the pyridine derivative is particularly preferable to be used in the present invention. In addition, uracil, quinoline, toluidine, aniline (and derivatives thereof), or the like can be also used as the weak base. The degree of dissociation thereof is also increased with temperature rising.

By contrast, examples of the weak acid include an acid whose degree of dissociation is decreased in an aqueous solution with temperature increase, such as formic acid, acetic acid, propionic acid, butyric acid, chloroacetic acid, phosphoric acid, oxalic acid and malonic acid. By contrast, an acid whose degree of dissociation is increased with temperature rising such as boric acid and carbonic acid can be also used. Furthermore, as described above, a salt obtained by the neutralization of the weak base and the weak acid also has a degree of dissociation having temperature dependence. The salt can be used as a weak ionization material in the present invention. The increase or decrease of the degree of dissociation depending on the temperature depends on the strength relation between the acid and the base.

A mixed system of a weak acid-a strong base, a mixed system of a weak base-a strong acid, or the like can be also used without independently using the weak acid or the weak base.

A change in temperature of a dielectric constant of a medium can also be used as a process for producing the colloidal polycrystal dispersion in which the colloidal crystals form at a given temperature. That is, an electrostatic interaction between the colloidal particles is increased with reduction in the dielectric constant. However, since a dielectric constant of a normal liquid is decreased with a temperature, the colloidal crystals can be also formed by changing the dielectric constant by heating.

The silica particles can be used as the colloidal particles of the colloidal polycrystal dispersion, water can be used as the dispersion medium, and pyridine and/or the pyridine derivative can be used as the weak base. A large single crystal having fewer lattice defects and less unevenness can be produced without fail by the colloidal polycrystal dispersion.

Even if the strong base is added to the colloidal polycrystal dispersion, the colloidal crystals can be formed at a given temperature. The temperature dependence with respect to the degree of dissociation of the strong base is believed to be low. Nevertheless, it is believed that the colloidal crystals can be formed based on a change in a dielectric constant of the colloidal polycrystal dispersion by the change in temperature and a change in a degree of dissociation of a functional group on the surface of the colloidal particle by the change in temperature even if the strong base is added. Furthermore, even if nothing is added to the colloidal polycrystal dispersion, the colloidal crystals can be formed by changing a temperature to change the dielectric constant of the colloidal polycrystal dispersion and the degree of dissociation of the functional group on the surface of the colloidal particles.

After the colloidal crystals are grown, the grown colloidal crystals can be also solidified by gelling. Thus, when the colloidal crystals are solidified by the gelling, the structure of the colloidal crystal can be held even if the temperature is returned to a temperature at which the colloidal crystals do not formed. The mechanical strength of the colloidal crystal can be dramatically enhanced. Furthermore, the gelled colloidal crystal is a material having a property intrinsic to a gel matrix. For example, when the gelled colloidal crystal is mechanically compressed to be deformed, a crystal lattice surface distance is also changed. Therefore, the gelled colloidal crystal is a material capable of controlling the diffraction wavelength. The gelled colloidal crystal swells and contracts in response to physical and chemical environments such as a kind of a liquid, a temperature, and pH. The introduction of a functional group specifically combined with a specific molecule changes a volume depending on the concentration of molecular species. The measurement of the shift of the diffraction wavelength using this property enables the sensing of a temperature, pH, various molecular species, or the like.

Examples of the gelling process include a process for dissolving light curing gelling reagents in a colloidal polycrystal dispersion, forming colloidal crystals, and thereafter irradiating the colloidal crystals with light to gel the colloidal crystals. In this case, a material with little generation of ions is preferably selected as a light curing gelling agent. This is because when the use of a light curing gelling agent that generates ions may change the surface potential of charged colloids dispersed in the colloidal polycrystal dispersion to cause the state change of the colloids. Examples of the light curing gelling agent with little generation of ions include a solution containing a gel monomer, a crosslinking agent and a photopolymerization initiator. Examples of the gel monomer include a vinyl monomer such as acryl amide and a derivative thereof. Examples of the crosslinking agent include N,N'-methylenebisacrylamide. Examples of the photopolymerization initiator include 2,2'-azobis[2-methyl-N-(2-hydroxyethyl)-propion amide]. In addition, a water-soluble photosensitive resin obtained by attaching an azide photosensitive group to polyvinyl alcohol, or the like can be also used.

In the process for producing the colloidal crystals of the present invention, in the recrystallization step, the vessel is cooled or heated from the one end side of the vessel by the temperature adjusting means to melt the colloidal polycrystals in the colloidal polycrystal dispersion, and cooling or heating caused by the temperature adjusting means is then stopped, thereby enabling the recrystallization of the colloidal polycrystals.

According to the inventor's test results, large colloidal crystals having fewer lattice defects and less unevenness can be produced without fail even if the process for recrystallizing the colloidal crystals is used. Since this process eliminates the use of the movement of the melting area as in the zone melting process, the device is simple. As a result, the production cost of the colloidal crystals can be reduced.

In the colloidal crystals obtained by the producing process of the present invention, a half-value width in an absorption spectrum and a reflection spectrum can be set to an extremely narrow range of 10 nm or less. Space unevenness of diffraction wavelength can be also set to 0.2% or less. Herein, the space unevenness is obtained by denoting by percentage a value obtained by dividing standard deviation of spatial distribution of the diffraction wavelength of the colloidal crystals measured by the reflective spectrum or the transmission spectrum by weighted average efficiency of the diffraction wavelength (hereafter the same).

In the producing process of the present invention, the diffraction wavelength is in a range of 400 to 800 nm, the unevenness of the diffraction wavelength is 0.2% or less, transmittance in the diffraction wavelength is 0.1% or less in a thickness of 1 mm, and the number of layers of the crystal lattice surfaces is 3000 or more. The colloidal crystals including a single crystal having a maximum diameter of 1 cm or more can be obtained.

Since the diffraction wavelength of the colloidal crystals is in a range of 400 to 800 nm, the colloidal crystals enable the diffraction of visible light. The space unevenness of the diffraction wavelength is 0.2% or less, and the accuracy of wavelength to be diffracted is extremely high. Since the transmittance in the diffraction wavelength is 0.1% or less, the efficiency of the diffraction is extremely good. The colloidal crystals having such a property can be applied to an optical communication connector, photoelectron elements for optical amplification or the like, a color video equipment, a high-energy laser, cosmetic/adornment fields or the like as photonic crystals.

DESCRIPTION OF SYMBOLS

Figure 1:
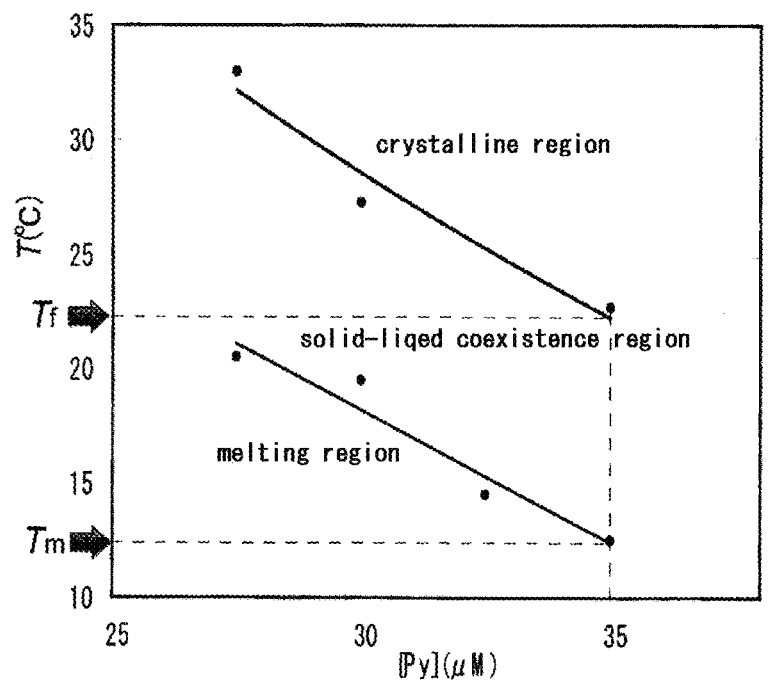
FIG. 1 is a graph showing a relation between a pyridine concentration determined from a melting test of a colloidal polycrystal dispersion and a melting point $T_m$, and a relation between the pyridine concentration and a freezing point $T_f$.

1, C . . . quartz cell (vessel)
2, 12 . . . thermocouple
3 . . . tank (temperature adjusting means)
4 . . . automatic X-axis stage (moving means)
5 . . . base
6 . . . stage
7 . . . stepping motor
9 . . . Peltier element
10 . . . convex member
11a, b . . . heat insulating member

BEST MODE FOR CARRYING OUT THE INVENTION

A silica-water system in which silica fine particles are dispersed in water is particularly preferable as an example of a colloidal polycrystal dispersion used in the present invention. When the silica fine particles are dispersed in water, a part of OH of an acidulant silanol group (Si—OH) covering the surface of the particle is dissociated to produce Si—O$^-$, and cations (H$^+$) referred to as counter ions are distributed around Si—O$^-$. When an ionization material such as pyridine is added to the system, the degree of dissociation of the silanol group is changed to change effective surface charge density $\sigma_e$ of the particles. Thus, the property capable of comparatively easily controlling the effective surface charge density $\sigma_e$ is the merit of the silica particles. Colloidal crystals can be prepared by using the property.

However, the colloidal polycrystal dispersion used in the process for producing colloidal crystals of the present invention is not limited to the silica-water system. The colloidal polycrystal dispersion can be also applied to other ionic colloidal dispersion systems. In the systems, colloidal particles having a surface having electric charges derived from a weak acid or a weak base thereon are dispersed in a liquid medium. When the weak ionization material is added thereto, the ionization material is dissociated (ionized) in the liquid medium and the electric charges on the surfaces of the colloidal particles can be changed.

That is, colloidal particles can be used as in silica as long as the colloidal particles have a surface having a weak acid thereon. For example, titanium oxide fine particles and a carboxy modified latex (a latex having a surface having a carboxyl group thereon) or the like can be used. A weak acid is added to colloidal particles having a surface having a weak base thereon, and thereby the colloidal particles can express a function similar to that of a silica+pyridine system. Examples of the colloidal particles corresponding thereto include a latex particles having an amino group, and aluminum oxide particles. Since the surface of the particle may have the property, the present invention can be also applied to particles having a surface on which a silica layer, a titanium oxide layer, or the like is coated.

The present invention can be also applied to a colloidal system made of clay mineral and spherical protein having both a weak acid and a weak base. Furthermore, the present invention can be also applied to a colloidal polycrystal dispersion containing various kinds of colloidal particles in which various weak acids and weak bases are introduced onto the surfaces of the silica particles by a surface-modifying process for introducing a weak base onto surfaces of silica particles using a silane coupling agent having an amino group.

Liquids other than water can be also used as a dispersion medium as long as the dispersion medium can express a high dielectric constant so that a dissociable group (electric charge applying group) and the added weak ionization material (weak acid, weak base, salt) on the surfaces of the colloidal particles can be dissociated. For example, formamides (for example, dimethylformamide) and alcohols (for example, ethylene glycols) can be used. These liquids can be used as they are, depending on the combination of the colloidal particles and the weak ionization material to be added. However, it is preferable that the liquids are generally used as a mixture with water.

A colloidal polycrystal dispersion obtained by dispersing commercially available colloidal particles in a suitable dispersion medium such as water, or by synthesizing using a sol-gel process or the like may be used as the colloidal polycrystal dispersion to which the weak acid and the weak base are added. However, the generation of the colloidal crystals is generally disturbed by the presence of a small amount of salt (ionic impurities). Thereby, it is preferable to sufficiently conduct desalination to prepare a colloidal dispersion system. For example, when water is used, the sample should be dialyzed against purified water until the electrical conductivity of the used water is generally equal to a value of the water before use. Next, desalting purification is conducted by making an ion-exchange resin (a mixed bed of a cation-exchange resin and an anion-exchange resin) that has been sufficiently washed coexist for a sample and by maintaining the ion-exchange resin for at least one week.

Furthermore, it is also necessary to pay attention to also the particle diameter of the colloidal particles and distribution thereof. The particle diameter of the colloidal particles is preferably 600 nm or less and more preferably 300 nm or less. This is because the colloidal particles having a large particle diameter exceeding 600 nm are easily precipitated under the influence of gravity. The standard deviation of the particle diameter of the colloidal particles is preferably within 15% and more preferably within 10%. When the standard deviation is large, the crystals are hardly produced. Even if the crystals are produced, lattice defects and unevenness are increased, and superior colloidal crystals are hardly obtained.

In the case of the colloidal polycrystal dispersion generating the colloidal crystals by a change in temperature by adding the weak ionization material, an electrostatic interaction between the colloidal particles governing crystallization in a charge colloidal system is influenced by not only the effective surface charge density ($\sigma_e$) of the particles but also a volume fraction ($\phi$) of the particles and an added salt concentration (Cs). Therefore, a temperature at which crystallization of the colloid occurs and an addition amount of the weak ionization material vary according to the volume fraction ($\phi$) and the added salt concentration (Cs) of the original colloidal dispersion system. For example, in the case where pyridine (Py) is added as the weak ionization material, the crystallization generally occurs under a condition that a pyridine concentration is higher as the Cs value is higher, when compared under a constant temperature and $\phi$ condition.

Generally, the colloidal dispersion system is prepared so that the volume fraction $\phi$ of the colloidal particles is about 0.01 to 0.05 and the added salt concentration Cs is about 2 to 10 μmol/L. The weak ionization material is added thereto. For this purpose, the specific gravity of the colloidal particles is determined by pycnometry or the like. The $\phi$ value of the colloidal particles of the purified colloidal dispersion system using the value can be determined by an drying up method. A dispersion system having a given $\phi$ value can be prepared by adding a liquid medium such as purified water to the colloidal dispersion system to dilute the colloidal dispersion system. The $\phi$ value is calculated so that the colloidal crystals have a crystal plane distance according to a desired property. If needed, a low molecule salt aqueous solution such as NaCl is added to control the Cs value.

In preparation of the colloidal polycrystal dispersion, it is necessary to avoid contamination by ionic impurities as much as possible. In this point, soda lime glass or the like that elutes basic impurities into water increases the $\sigma_e$ value of the particles. Thereby, when a glass vessel is used, a glass vessel not eluting basic impurities into water, such as silica glass, is preferable. Since carbon dioxide in air is dissolved in water to produce carbonic acid, the colloidal polycrystal dispersion is preferably prepared in an atmosphere of nitrogen or the like. Furthermore, vessels and instruments used for crystallizing the colloid are sufficiently washed with purified water (electrical conductivity of 0.6 μS/cm or less), and are then used.

The colloidal system prepared as described above is heated or cooled. The existence or nonexistence of the crystals is confirmed, and thereby a crystallization temperature can be evaluated. An X-ray scattering process, an optical microscope process, a spectrophotometric process (reflection or transmission spectrum measurement), or the like can be applied, in addition to observation of iridescence, in order to confirm the generation of the crystals, In the process for producing the colloidal crystals of the present invention, the crystallization of the colloidal particles can be thermally reversibly produced by a simple means for merely heating or cooling the system externally. The crystallization can be controlled by changing the concentration of the weak ionization material such as pyridine. However, in that case, the concentration of the weak ionization material may not be at a strict level unlike the case of adding a strong base such as NaOH. That is, since the concentration of the dissociation species is much smaller than that of the added weak ionization material, a change in the surface charge density ($\sigma_e$) of the colloidal particles to the concentration of the weak ionization material is more moderate than that in the case of adding the strong base. A certain amount of concentration range is advantageously permitted.

The crystallization temperature can be easily adjusted by changing the concentration of the weak ionization material.

The present inventors have already confirmed that the crystallization temperature of the colloid of the silica-water system using pyridine can be adjusted in a range of 2° C. to 60° C.

Since the system can be hermetically maintained in the present invention, the contamination by the ionic impurities can be prevented to obtain high-efficiency colloidal crystals. Thus, the present invention is expected to be extensively applied to production of an optical element or the like capable of controlling photoresponsive property.

The process for producing the colloidal crystals of the present invention uses the colloidal system containing colloidal particles having the surface having electric charges, the dispersion medium for dispersing the colloidal particles, and the weak ionization material having the degree of dissociation changed with the change in temperature in the dispersion medium. The process can externally apply a change in temperature to the colloidal system to produce the colloidal crystals. Since the weak ionization material-containing colloidal system is reversibly crystallized by the change in temperature to change physical properties, the colloidal system can be applied to applications other than the production of the colloidal crystals by using the characteristic.

For example, a novel thermosensitive material (a thermosensitive paint, a temperature sensor, or the like) using a change in physical properties caused by a change in temperature can be developed. When a system in which a colloidal system is crystallized by rising temperature is used, the viscosity of the system is expected to be increased with a temperature. By contrast, generally, viscosity of a usual simple liquid is monotonically decreased with temperature increase. Application, for example, to improvement in the temperature property of a liquid (clutch oil or the like) used, for example, for a conventional stress transfer system is also expected by using the peculiar viscous-temperature property.

Hereinafter, examples further embodying the present invention will be described in detail.

<Preparation of Colloidal Polycrystal Dispersion>

A colloidal polycrystal dispersion was prepared as follows.

Silica colloidal particles KE-W10 (diameter: 0.11±0.01 µm, specific gravity: 2.1) manufactured by Nippon Shokubai Co., Ltd. were purified using dialysis by a semipermeable membrane, and an ion-exchange process using an ion-exchange resin. Silica colloid from which ions were thus removed was adjusted so that a volume fraction ($\phi$)=0.050 was set, and pyridine was added thereto so that a pyridine concentration was set to a given concentration to produce a colloidal polycrystal dispersion. The colloidal polycrystal dispersion became clouded when the colloidal polycrystal dispersion was mixed under a strong shaking condition at room temperature. However, when the colloidal polycrystal dispersion was left still, fine colloidal polycrystals glitteringly shining in an interference color were observed with the naked eye within 1 minute.

<Melting Test of Colloidal Polycrystal Dispersion>

A melting test of colloidal crystals for the colloidal polycrystal dispersion thus obtained was conducted. That is, a quartz cell having a thickness of 1 mm, a width of 1 cm and a length of 4.5 cm as inner sizes was filled with the colloidal polycrystal dispersion. The quartz cell was put into a constant temperature bath, and a melting point was measured while the whole temperature was reduced. Whether the temperature reached the melting point was determined by observation with the naked eye. That is, when the colloidal crystals melt, the colloidal crystals are changed to a clouded molten state through a solid-liquid coexistence state where shining points are scattered from a colloidal polycrystal state glitteringly shining in the interference color. A temperature at a time of shift from a melt state to the solid-liquid coexistence state was defined as a melting point $T_m$. A temperature at a time of shift from the solid-liquid coexistence state to a crystal state was defined as a coagulating point $T_f$. The melting points $T_m$ and the coagulating points $T_f$ were measured in various pyridine concentrations.

As a result, as shown in FIG. 1, it was found that $T_m$ and $T_f$ depend on the concentration of added pyridine: the higher the concentration of pyridine is, the more $T_m$ and $T_f$ are reduced, and the values of $T_m$ and $T_f$ can be controlled by the addition amount of pyridine.

Figure 2:
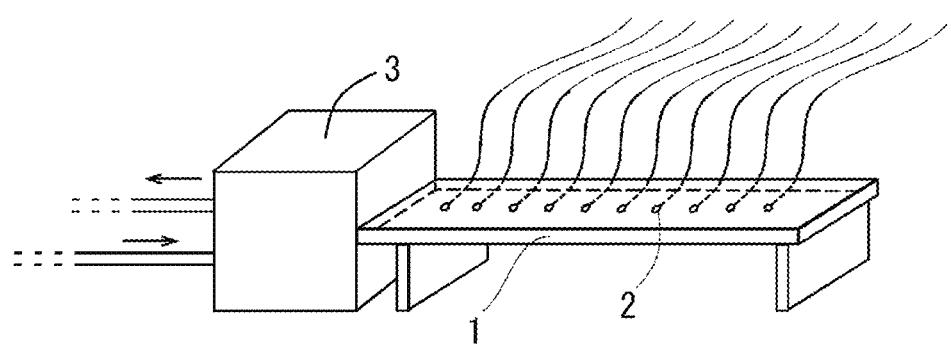
FIG. 2 is a schematic view of an experimental device for determining a melting curve of the colloidal polycrystal dispersion.

Furthermore, a melting test to be shown later was conducted. That is, as shown in FIG. 2, the quartz cell 1 filled with the colloidal polycrystal dispersion was horizontally fixed. Many thermocouples 2 were set on a central part of the quartz cell 1 in a width direction and at equal intervals in a length direction on the upper surface side of the quartz cell 1. The thermocouples 2 were able to measure temperatures of portions. One end side of the quartz cell 1 was brought into contact with a tank 3 connected to a cooling-water circulation device (not shown). Thereby, the colloidal crystals melt from the one end side to the other end side while cold water of a given temperature (0° C., 3° C., 7° C.) was circulated. The melting condition of the colloidal crystals was able to be clearly confirmed with the naked eye. That is, before the tank 3 was brought into contact with the quartz cell 1, the whole cell was a crystal area where the interference color was observed. By contrast, after the tank 3 was brought into contact with the one end of the quartz cell 1, it was observed that a melting area having a state where the colloidal crystals melt to become clouded expands from the one end side to the other end side. Shining points were scattered between the melting area and the crystal area, and a solid-liquid coexistence area was recognized. A temperature of a boundary between the melting area and the solid-liquid coexistence area was measured as the melting point $T_m$. A temperature of a boundary between the solid-liquid coexistence area and the crystal area was measured as the coagulating point $T_f$.

Figure 3:
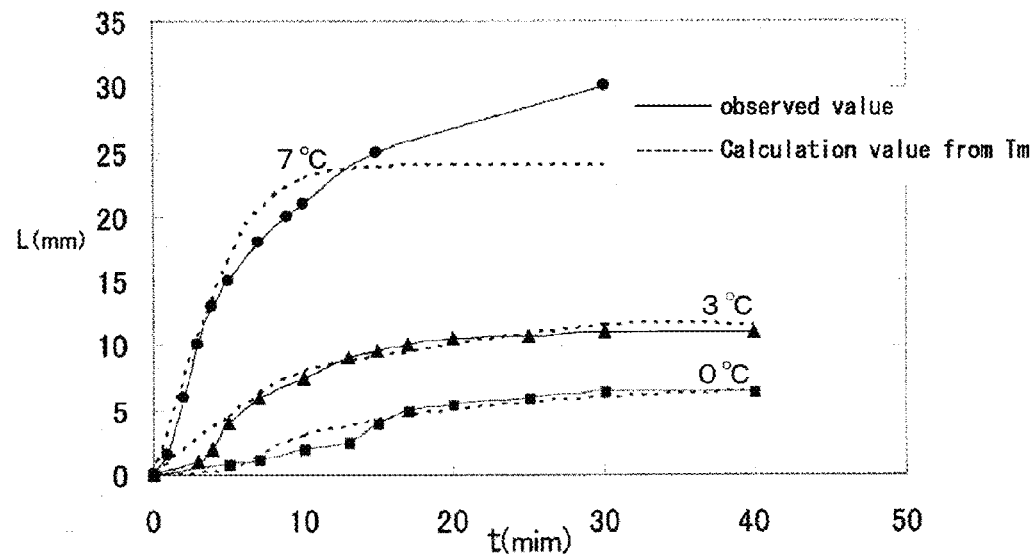
FIG. 3 is a graph showing a melting curve of the colloidal polycrystal dispersion.

As a result, melting curves (L shown in FIG. 3 represents a distance from the tank 3) shown in FIG. 3 were obtained. Each of the values of $T_m$ showed good coincidence with the calculated value from the value of $T_m$ obtained in FIG. 1.

<Formation of Colloidal Crystals by Zone Melting Process>

Example 1-1

In Example 1-1, a gigantic colloidal single crystal was prepared from fine colloidal polycrystals by a zone melting process to be shown later.

First, silica colloidal particles KE-W10 (diameter: 0.11±0.01 µm, specific gravity: 2.1) manufactured by Nippon Shokubai Co., Ltd. were purified using dialysis by a semipermeable membrane, and an ion-exchange process using an ion-exchange resin. A silica colloid from which ions were thus removed was adjusted so that a volume fraction ($\phi$)=0.050 was set, and pyridine was added thereto so that a pyridine concentration was set to produce 50 µmol/L to produce a colloidal polycrystal dispersion. When the colloidal polycrystal dispersion was left at room temperature, fine colloidal polycrystals glitteringly shining were observed with the naked eye. The colloidal polycrystal dispersion was separately put into the quartz cell. The fine colloidal polycrystals were formed, and the colloidal polycrystal dispersion was then cooled. When a temperature at which the colloidal crystals melt was measured, the temperature was 10° C.

Figure 4:
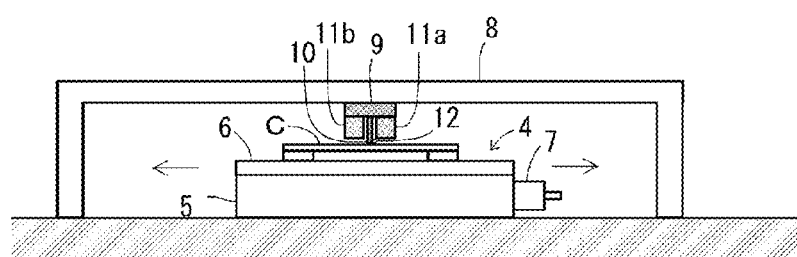
FIG. 4 is a schematic view of a device used for precipitation of colloidal crystals by a zone melting process.

A quartz cell C shown in FIG. 4 and having a thickness of 1 mm, a width of 1 cm and a length of 4.5 cm as inner sizes was filled with the colloidal polycrystal dispersion in which the fine colloidal polycrystals were dispersed. The quartz cell C was set on a commercially available automatic X-axis stage 4 so that the quartz cell C was parallel to a level surface. In the automatic X-axis stage 4, a rectangular stage 6 is provided on a base 5, and a stepping motor 7 is attached to one end of the base 5. The stage 6 can be moved in a longitudinal direction via a rack-pinion mechanism (not shown) by driving the stepping motor 7. The stage 6 can be moved in one direction at a given rate by controlling the stepping motor 7 using a control device (not shown).

A U-shaped jig 8 is set so as to straddle the automatic X-axis stage 4. A Peltier element 9 is attached to the central lower side of the jig 8 so that the Peltier element 9 cools the lower side. A sheetlike convex member 10 made of aluminum is set in the center of the lower surface side of the Peltier element 9 so that the sheetlike convex member 10 abuts on the Peltier element 9 and is protruded downward. The width direction of the convex member 10 is the same as the width direction of the quartz cell C. The tip of the convex member 10 is brought into contact with the quartz cell C. The Peltier element 9 can be cooled by supply of electric power from a power source (not shown) so that a temperature of a lower surface side of the Peltier element 9 is set to a given temperature. Heat insulating members 11a and b are provided on both the sides of the convex member 10 via a slight clearance between the convex member 10 and the heat insulating members 11a and b so that the heat insulating members 11a and b face to the convex member 10. A thermocouple 12 is attached to the vicinity of the tip of the convex member 10.

The quartz cell C into which the colloidal polycrystal dispersion was put was attached to the stage 6 of the automatic X-axis stage 4. The precipitation of the colloidal crystals was observed with the naked eye within 1 minute after the attachment. After colloidal crystals were thus precipitated, electric power was supplied to the Peltier element 9, and the stepping motor 7 was driven by the control device to move the stage 6 to one direction at a speed of 2 mm/min. Thereby, the convex member 10 abutting on the cooling surface of the Peltier element 9 was cooled to cool a portion facing the convex member 10 of the quartz cell C to a given temperature. The quartz cell C was moved with the stage 6 to move a cooled portion of the quartz cell C to one direction at a speed of 2 mm/min.

Figures 5, 6:
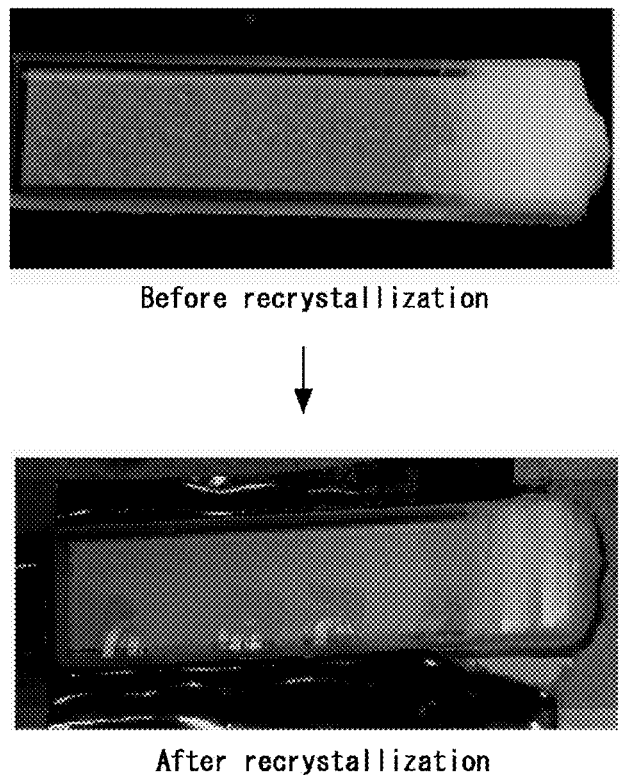
FIG. 5 shows photographs before and after the precipitation of the colloidal crystals by the zone melting process.
FIG. 6 is a view showing an appearance and a crystal size of the colloidal crystals when a moving speed of a Peltier element is changed.

FIG. 5 shows conditions before recrystallization and after recrystallization by the zone melting process. The photographs show that although many fine polycrystals were observed before the recrystallization, an even interference color was produced after the recrystallization to promote single crystallization. Furthermore, the reflection spectrum and absorption spectrum of the colloidal crystals thus obtained were measured by a fiber spectroscopic process. As a result, it was found that the half-value width before the recrystallization was 6.33 nm, and the half-value width after the recrystallization was 5.28 nm (diffraction wavelengths were 554 nm both before and after the crystallization), thereby enhancing the optical property of the crystal by the recrystallization.

The number of layers of a crystal lattice surface of the obtained colloidal single crystal was calculated as follows according to the Bragg expression. That is, $2d \cdot \sin\theta = N \cdot \lambda/n_r$ is set according to the Bragg expression (herein, d: a distance between lattice surfaces, $\theta$: an angle between incidence light and a lattice surface, N: a natural number, $\lambda$: diffraction wavelength, $n_r$: a refractive index of a sample). In the measurement of Example 1, $\theta=90°$ ($\sin\theta=1$) and $N=1$ are set, and $n_r = \phi n_{silica\ particle} + (1-\phi) n_{water}$ ($n_{silica\ particle}=1.46$, $n_{water}=1.33$) can be approximately set. When $\phi=0.050$ is set, $n_r=1.45$ is set, and $d=\lambda/(2nr)=191$ nm is calculated. Consequently, it was found that the number of the crystal lattice surfaces is about 5200 (layer) in the crystal having a thickness of 1 mm, and the number of layers is numerous.

A difference in the diffraction wavelength depending on places was investigated. It was found that fluctuation in the diffraction wavelength is very slight (1 nm or less); the space unevenness is calculated to be 0.04% in reflection spectrum measurement and 0.05% in transmission spectrum measurement; and the colloidal single crystal has extremely excellent evenness. Furthermore, it was found that transmittance in the diffraction wavelength in a thickness of 1 mm is 0.009, and the colloidal single crystal exhibits excellent performance as a diffraction grating. It was found that transmittance in the wavelength slightly separated from the diffraction wavelength is large, and the colloidal single crystal has excellent transparency except the diffraction wavelength.

Examples 1-2 to 1-4

In Examples 1-2 to 1-4, colloidal crystals were prepared at the moving speed of the Peltier element 9 which is different from that in the case of Example 1-1 (that is, 18 mm/min in Example 1-2, 30 mm/min in Example 1-3, and 42 ram/min in Example 1-4). Other preparation conditions are the same as those in Example 1-1. The results are shown in FIG. 6. FIG. 6 shows that the larger a moving speed v of a cooling portion (that is, a melting area of colloidal polycrystals) is, the smaller a crystal size is.

Figure 7:
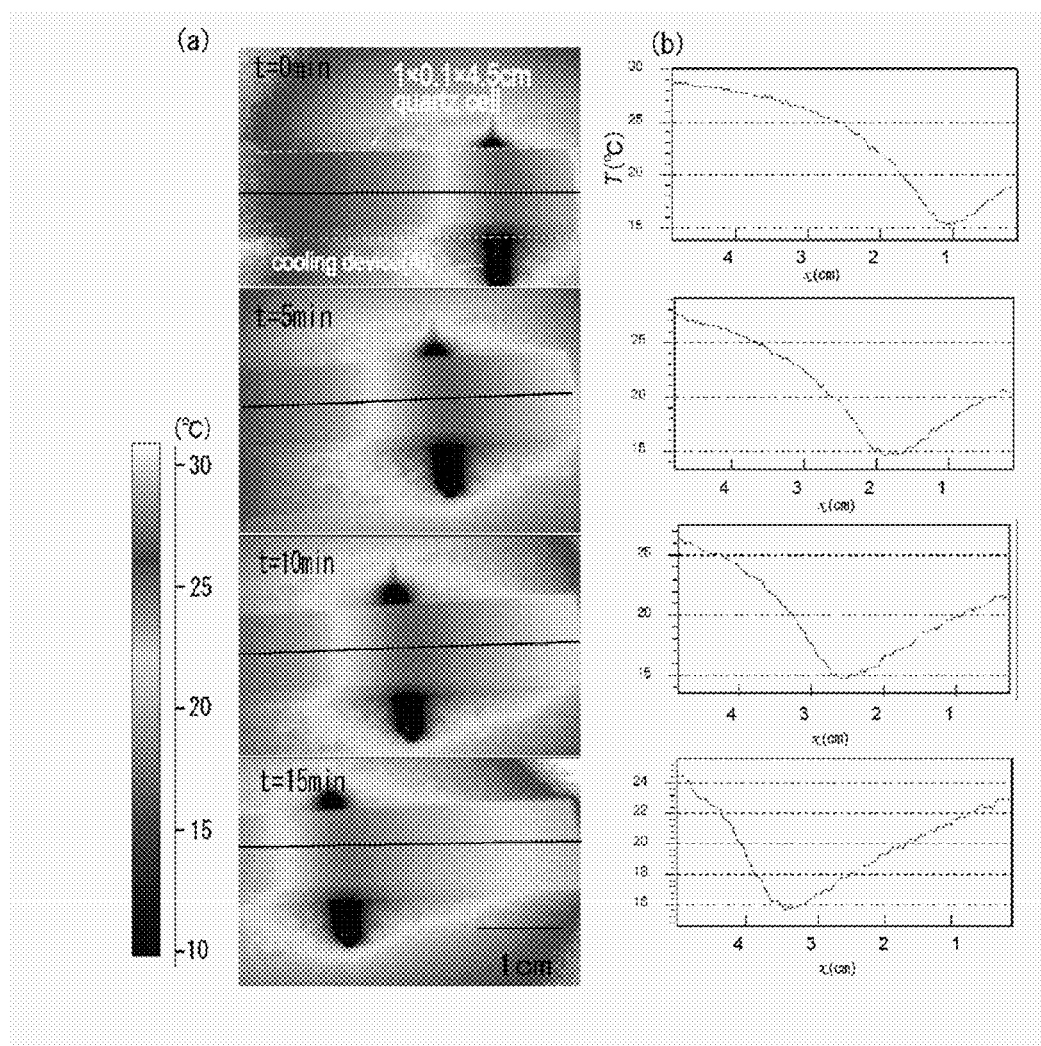
FIG. 7 shows photographs showing results obtained by measuring a surface temperature of a cell using an infrared type thermography device when the colloidal crystals are crystallized into a single crystal by the zone melting process.

In the preparation of the colloidal crystals of Example 1-1 (that is, v=2 mm/min), a surface temperature of a cell opposite to the Peltier element 9 was measured using an infrared type thermography device (TH6300 type manufactured by NEC/Avio Corporation). The results are shown in FIG. 7. FIG. 7A shows temperature distribution images of every 5 minutes. FIG. 7B shows a relation between a temperature and a position x (a distance from a left end of a cell) on a horizontal line shown in each of the images of FIG. 7A. In FIG. 7A, a portion of 15° C. or less looking the darkest is the Peltier element 9. A portion brought into contact with the Peltier element 9 is the melting area of the colloidal crystals.

The same surface temperature measurement was conducted in Example 1-4 (v=42 mm/min), Example 1-3 (v=30 mm/min) and Example 1-2 (v=18 mm/min). As a result, a surface temperature of a cell opposite to a side brought into contact with the Peltier element 9 is 23° C. in Example 1-4, 22° C. in Example 1-3 and 18° C. in Example 1-2.

<Impurity Excluding Experiment by Zone Melting Process>

Example 2-1

In Example 2-1, fluorescence polystyrene particles were used as imitation impurities, and an exclusion test of impurity particles by a zone melting process was conducted. Hereinafter, the test process will be described in detail.

Figure 8:
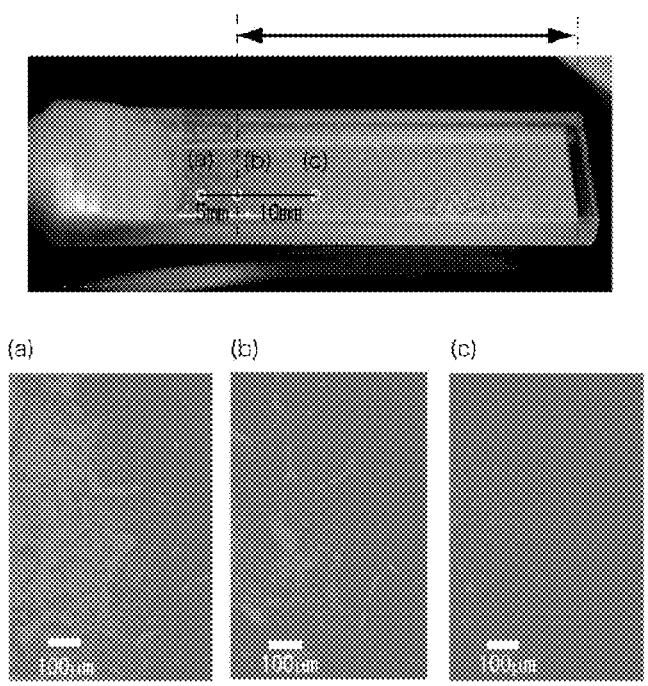
FIG. 8 is a photograph after an impurity excluding test by the zone melting process.

That is, fluorescence polystyrene fine particles (particle diameter=100 nm) as model impurities were added to a dispersion liquid in which pyridine of 50 μmol/L was added to purified silica colloid (particle diameter=100 nm, particle concentration=5 vol %) so that a particle concentration=0.02 vol % was set. The colloidal polycrystal dispersion thus prepared was an assembly of microcrystals of 1 mm or less. The colloidal polycrystal dispersion was put into a quartz cell of 1×1×4.5 cm. The zone melting device used in Example 1-1 was used. Zone melting treatment was conducted by moving the Peltier element 9 leftward by about 3 cm from the right end of a cell at a speed/of 2 mm/min at 25° C. while controlling the Peltier element 9 so that the tip of the convex member 10 was set to 3° C. The appearance of colloidal crystals thus obtained is shown in FIG. 8. It is found that a portion indicated by arrows in FIG. 8 is a portion subjected to zone melting treatment and a colloidal single crystal precipitates in the portion. A polycrystal area was left on the left side end of the portion subjected to the zone melting treatment. Furthermore, results obtained by investigating distribution of fluorescence particles using a fluorescence microscope are shown in FIG. 8. Fluorescence microscope images in a polycrystal area (a), a boundary area (b), and a recrystalliZation area (c) shown on the upper side of FIG. 8 are shown on the lower side of FIG. 8. Clear fluorescence was observed in the polycrystal area (a). However, fluorescence was hardly observed in the recrystallization area (c). From these results, it was found that the fluorescence particles as the imitation impurities are eliminated from the single crystal portion.

Example 2-2

In Example 2-2, fluorescence polystyrene fine particles (particle diameter=100 nm) were added so that a particle concentration=0.0005 vol % was set, to set a pyridine concentration to 55 μmol/L. Other conditions are the same as those in Example 2-1, and the detailed description thereof is omitted.

Figure 9:
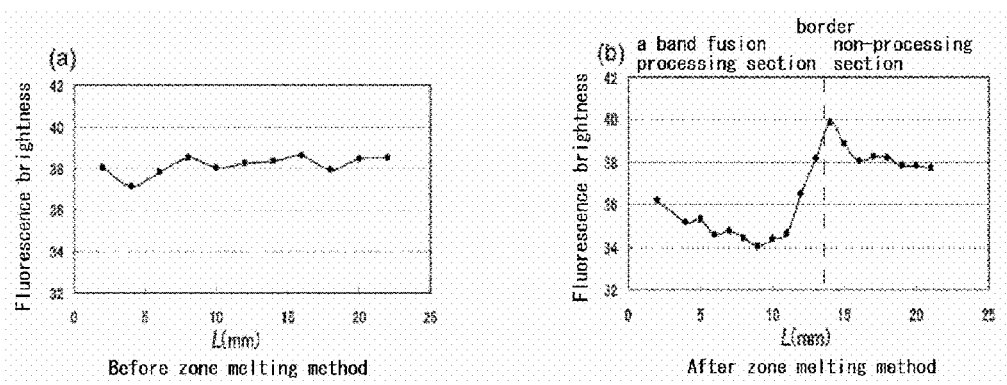
FIG. 9 is a graph obtained by measuring fluorescence luminance distribution of a photograph obtained by photographing a fluorescence image of the colloidal crystals.

The fluorescence images of the colloidal crystals thus obtained were photographed at intervals of 1 mm, and fluorescence luminosity was measured using an image-analysis software. The results are shown in FIG. 9. As is apparent from FIG. 9, the luminosity of the recrystallization area after the zone melting treatment is decreased as compared with that before the zone melting treatment, and a boundary portion has the largest luminosity. That is, it was found the fluorescence polystyrene particles are eliminated from the recrystallized portion by the zone melting treatment and accumulate at the boundary.

Figure 10:
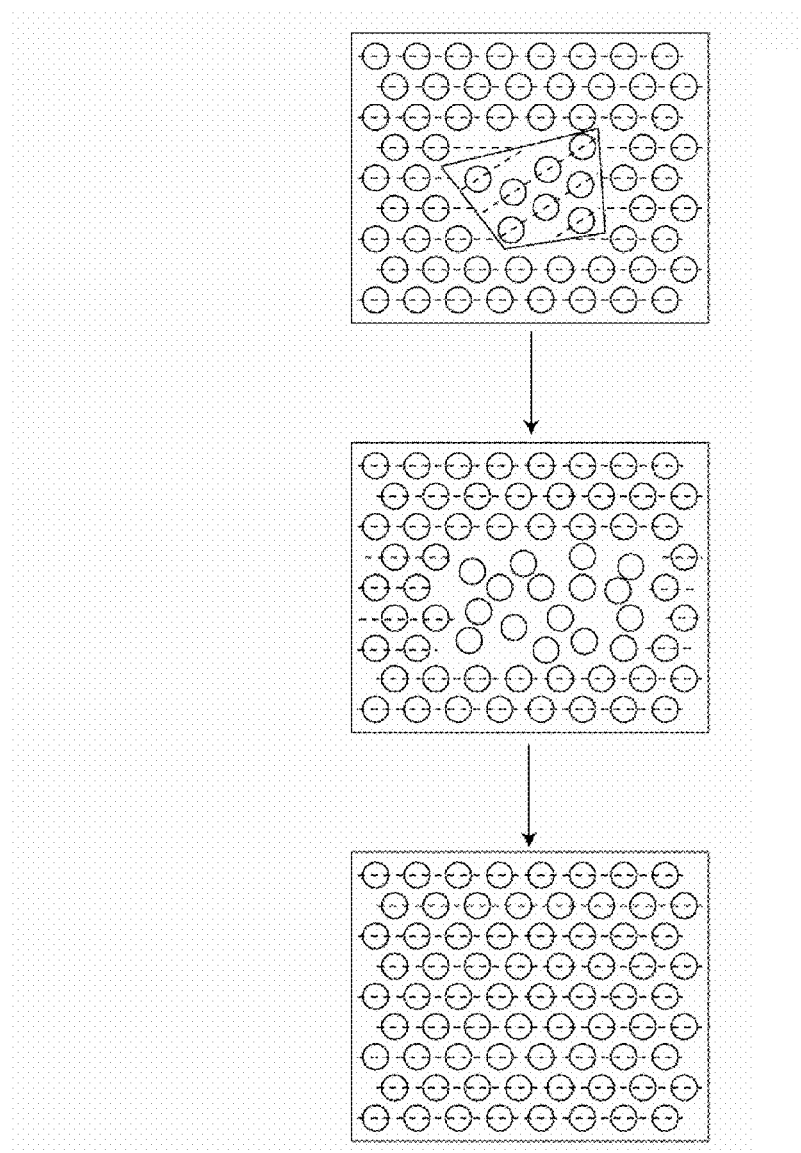
FIG. 10 shows the principle of recrystallization by the zone melting process.

The above results mean that the zone melting process conventionally used for obtaining a single crystal made of silicon or the like can be applied also to a colloidal crystal system. That is, a crystal grain boundary has a melting point lower than that of the inside of the crystal. Thereby, when the colloidal polycrystals are cooled by the zone melting process to melt minute crystal grains, and are reheated to be crystallized, crystals having the same orientation as surrounding crystal orientation are reconstructed to promote single crystallization (see FIG. 10). Similarly, other crystal defects (for example, vacancy, twin crystal defect, or the like) are presumed to be able to be removed by the zone melting process for conducting melting/recrystallization.

<Preparation of Colloidal Crystals by Process for Stopping Cooling After Cooling from One Direction to Precipitate Colloidal Crystals>

Example 3

In Example 3, a quartz cell filled with a colloidal polycrystal dispersion containing colloidal polycrystals was cooled from one direction. The cooling was then stopped to recrystallize the colloidal polycrystals, thereby preparing a gigantic colloidal single crystal from the fine colloidal polycrystals.

Figure 11:
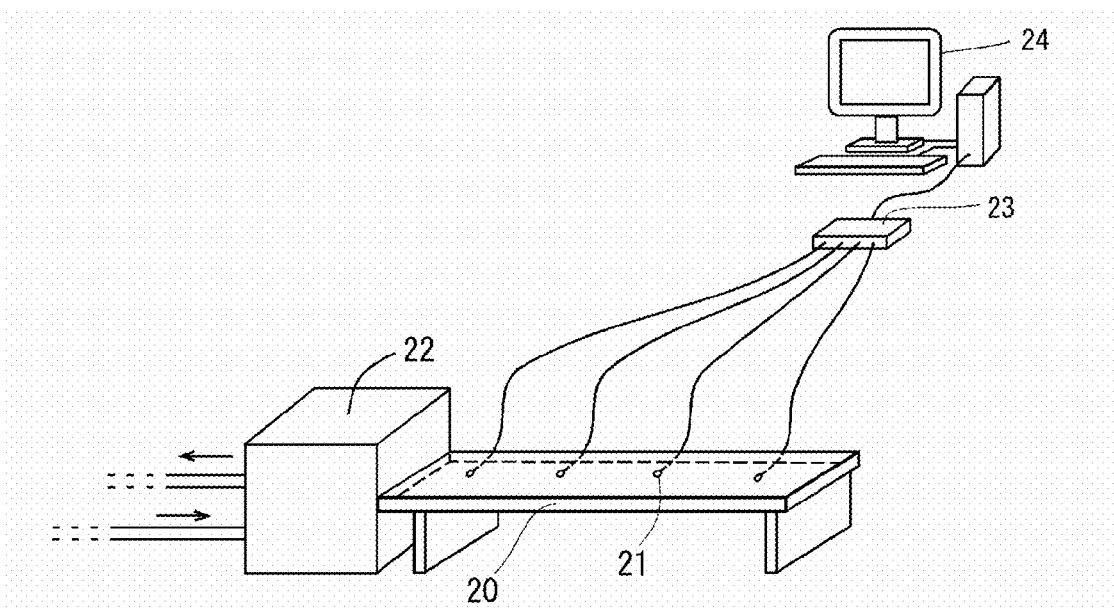
FIG. 11 is a schematic view of a device used for a process for producing colloidal crystals of Example 3.

A volume fraction (φ) of silica colloid in the colloidal polycrystal dispersion for crystallization was set to 0.035, and a pyridine concentration was set to 50 μmol/L. Other conditions for preparing the colloidal polycrystal dispersion are the same as those in Example 1, and the description thereof is omitted. The same quartz cell as that in Example 1 was filled with the colloidal polycrystal dispersion thus obtained. As shown in FIG. 11, a quartz cell 20 was horizontally fixed. Four thermocouples 21 were abutted on the upper surface side of quartz cell 20 at a central portion in a width direction so as to be able to measure a temperature of each portion. One end side of the quartz cell 20 was brought into contact with a tank 22 connected to a cooling-water circulation device (not shown) to set the one end side to 0° C. The colloidal crystals melt from the one end side to the other end side, and the tank 22 was then separated from the quartz cell 20 to reprecipitate the colloidal crystals. The thermocouples 21 were set at positions separated by 2.5 mm, 7.5 mm, 12.5 mm, and 17.5 mm from the tank 22. Signals from the thermocouples 21 were digitized by an A/D converter 23. The digitized signals were downloaded to a personal computer 24 as digital data.

The precipitation condition of the colloidal crystals was observed with the naked eye. The melting condition of the colloidal crystals was able to be clearly confirmed with the naked eye. That is, when the cooling by the tank 22 was stopped, a melting area having a state where the colloidal crystals melt and became clouded was recognized on a side near the tank 22. A crystal area where the colloidal crystals did not melt and an interference color was observed was recognized on a side far from the tank 22.

Figure 12:
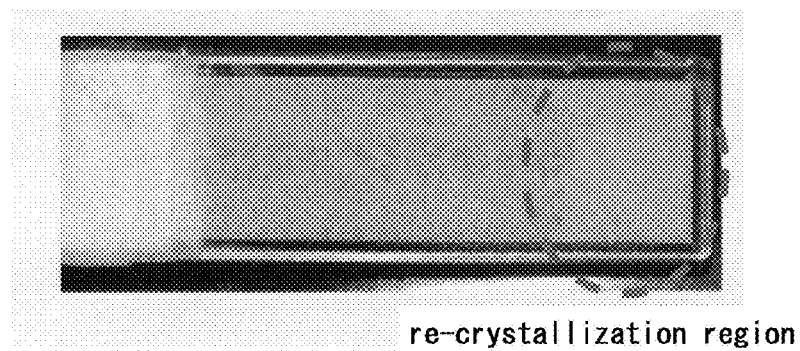
FIG. 12 is a photograph of the colloidal crystals after recrystallization is conducted.
Figure 13:
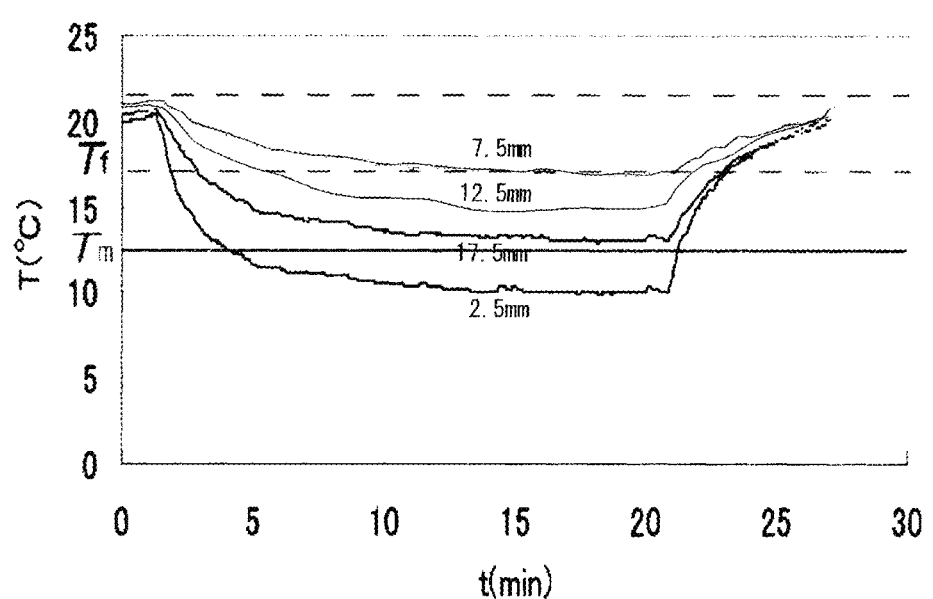
FIG. 13 is a graph showing a relation between a lapsed time and a temperature in each part in a process for cooling from one direction and thereafter stopping the cooling to precipitate the colloidal crystals.

A photograph of the colloidal crystals thus precipitated is shown in FIG. 12. Temperatures of portions are shown in FIG. 13 ("mm" in FIG. 13 designates a distance from the tank 22). As shown in FIG. 12, a single crystal area in which colloidal polycrystals melt and recrystallized to exhibit an even interference color was able to be clearly distinguished from an area in which the colloidal polycrystals remained still without melt. Reflection spectra were measured on the recrystallized portion and the non-recrystallized portion. As a result, the center wavelengths of these portions were both 620 nm. However, the non-recrystallized portion had a half-value width of 5.47 nm. By contrast, the recrystallized portion had a smaller half-value width of 4.64 nm, and had excellent optical property.

Figure 14:
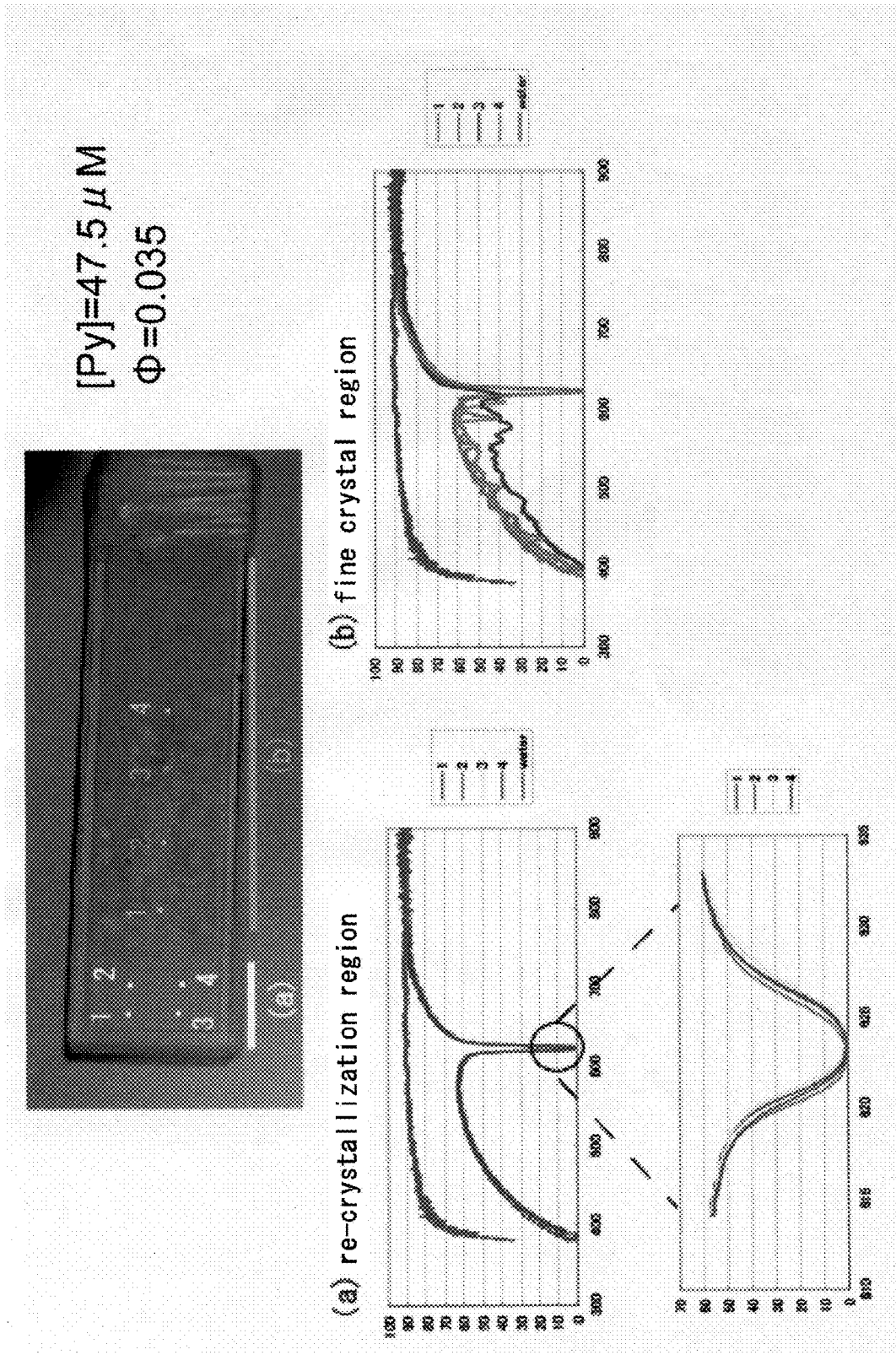
FIG. 14 is a photograph of colloidal crystals after recrystallization is conducted with a pyridine concentration set to 47.5 µMOL/L and a volume fraction ($\phi$) of silica colloid set to 0.035, and a graph showing transmission spectra of a polycrystal area and a recrystallization area.

Transmission spectra were measured. As shown in FIG. 14, it was found that the non-recrystallized portion has different spectra depending on location in the portion. By contrast, it was found that the recrystallized portion has almost the same spectra in any location and has excellent optical evenness.

Figure 15:
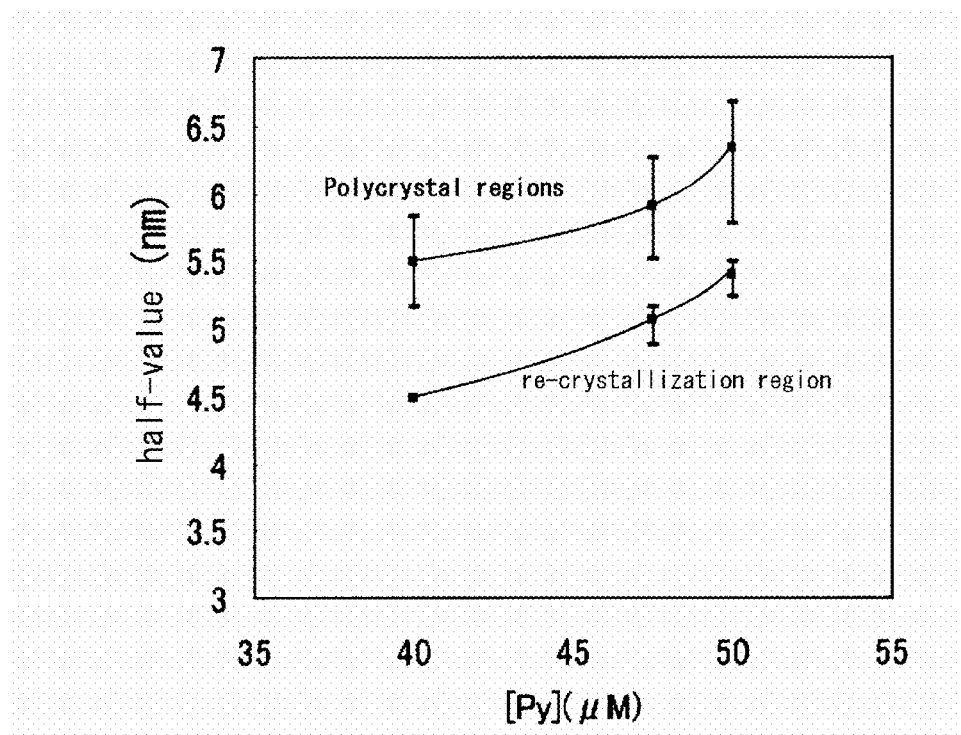
FIG. 15 is a graph showing a relation between the pyridine concentration in the colloidal polycrystal dispersion and a half-value width.

The pyridine concentration in the colloidal polycrystal dispersion was changed to 40 μmol/L, 47.5 μmol/L and 50 μmol/L, and the tests were similarly conducted to measure the reflection spectra on the polycrystal area and the recrystallization area. As a result, as shown in FIG. 15, the lower the pyridine concentration was, the smaller half-value width was.

Figure 16:
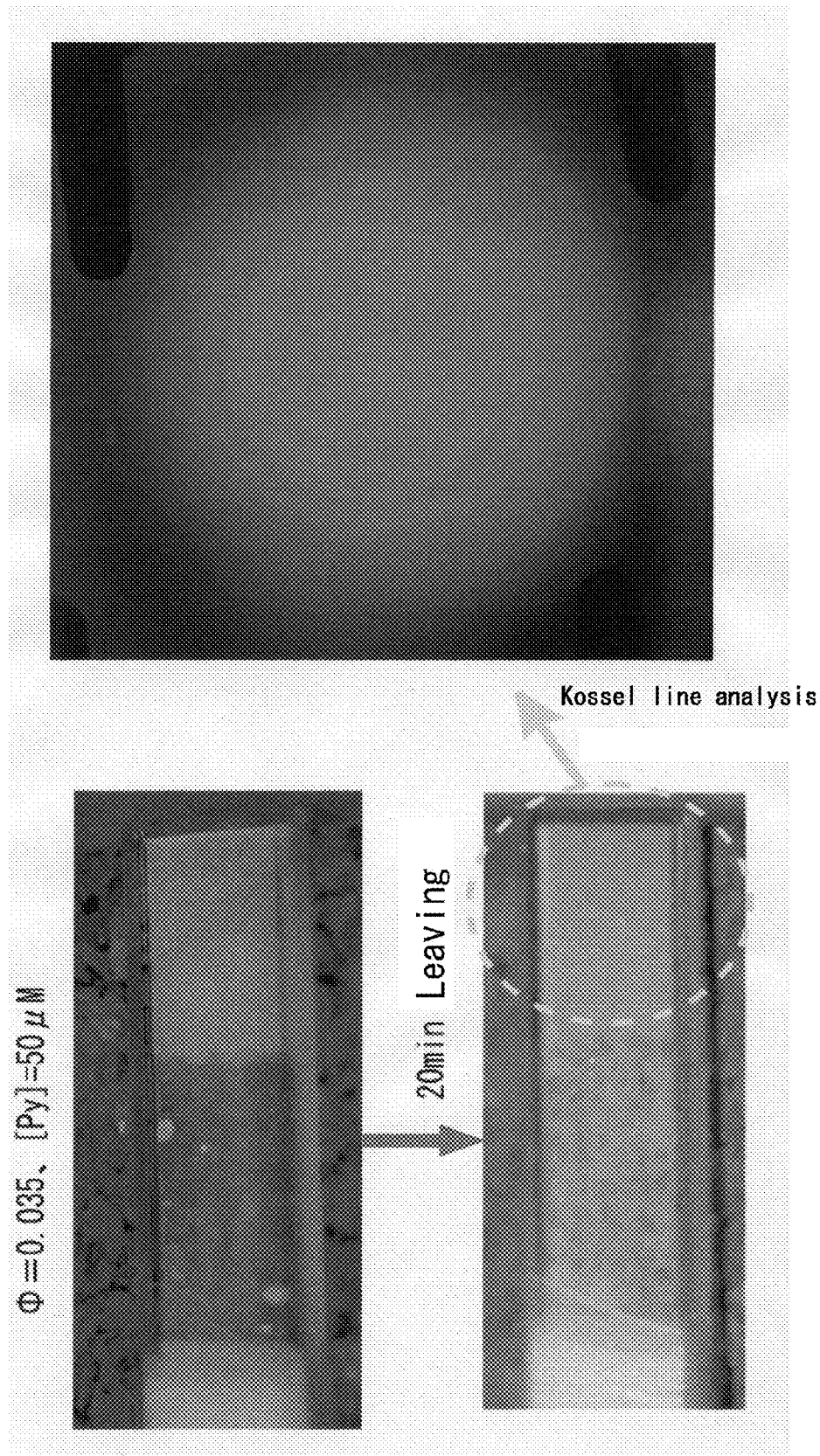
FIG. 16 is a diffraction pattern obtained by Kossel line analysis of the recrystallization area.

A colloid recrystallization area prepared using the colloidal polycrystal dispersion having the pyridine concentration of 50 μmol/L was subjected to Kossel line analysis. A Kossel line originally refers to a characteristic diffraction pattern. When a single crystal material is irradiated with X-rays, characteristic X-rays secondarily generated in a crystal function as a point light source. The characteristic diffraction pattern is obtained by the light diffracting various crystal lattice surfaces. The orientation and the lattice structure of a crystal lattice can be determined by the analysis of the Kossel line. The process was applied to the colloidal crystals, and Kossel line analysis was conducted according to a process (T. Kanai, T. Sawada, I. Maki, K. Kitamura. Jpn. J. Appl. Phys., vol. 42, p. L655 (2003)) of Sawada et al. Since a lattice spacing of the colloidal crystals was order of light wavelength, not the X-rays but a laser beam was used. A light diffusion plate equivalent to the point light source was provided between a sample cell and a laser light source to obtain conically expanding incidence light (A schematic view of a Kossel line analysis device is described in Supporting Information of A. Toyotama, J. Yamanaka, M. Yonese, T. Sawada, F. Uchida, J. Am. Chem. Soc. vol. 129, p. 3044 (2007)). According to the process, a portion, which was removed by diffraction, of the conic light entering into the colloidal crystals is observed as a shadow. A Kossel line photograph of the single crystal thus obtained is shown in FIG. 16. FIG. 16 leads to the conclusion that a central ring-shaped pattern is diffraction from a BCC {110} plane orientated in parallel with a cell wall surface, and a pattern around the ring is based on a BCC {200} plane (A. Toyotama, J. Yamanaka, M. Yonese, T. Sawada, F. Uchida, J. Am. Chem. Soc. vol. 129, p. 3044 (2007)). As shown in FIG. 16, it was supported that the sufficiently oriented single crystal is formed.

<Gelling of Colloidal Crystals>

Examples 3-1 to 3-3

The colloidal crystals prepared by the above process were fixed by a known process (Japanese Patent Application No. 2004-375594: COLLOID CRYSTAL FIXED IN GEL (Inventors: Junpei Yamanaka, Masako Murai, Koji Yamada, Hiroshi Ozaki, Fumio Uchida, Tsutomu Sawada, Akiko Toyotama, Kensaku Ito, Yoshihiro Takiguchi, Hirohito Taira (Japanese Patent Application No. 2004-375594), Applicants: Japan Aerospace Exploration Agency and Fuji Kagaku Corporation)).

That is, a silica colloidal polycrystal dispersion was first prepared, which was obtained by mixing N-methylolacrylamide (hereinafter, referred to as "N-MAM"), N,N'-methylenebisacrylamide (hereinafter, referred to as "Bis"), 2,2'-azobis[2-methyl-N-(2-hydroxyethyl)-propionamide] (hereinafter, referred to as "PA"), a silica colloidal dispersion and pyridine in a given ratio. Herein, Bis serves as a crosslinking agent, and PA serves as a photopolymerization initiator. As the composition of the silica colloidal polycrystal dispersion, a volume fraction ($\phi$) of the silica colloid was set to 0.05; a pyridine concentration was set to 42.5 μmol/L; a Bis concentration was set to 5 mmol/L; a PA concentration was set to 50 μg/ml; and an N-MAM concentration was set to 195 to 390 mmol/L (that is, 195 mmol/L in Example 3-1, mmol/L in Example 3-2, and 390 mmol/L in Example 3-3).

The silica colloidal polycrystal dispersion thus obtained was put into the cell used in Example 1-1. A colloidal single crystal was obtained by the zone melting process in a darkroom. Furthermore, the colloidal single crystal was irradiated with ultraviolet light to polymerize N-MAM.

As a result, as shown in Table 1, it was found that as the concentration of N-MAM is higher, the silica colloidal polycrystal dispersion turns into a harder gel state (in Table 1, good designates a hard gel state; average designates a soft gel state; and poor designates a non-gelled flow state).

TABLE 1

|  | N-MAM (mM) | Bis (mM) | PA (μg/ml) | gelling |
|---|---|---|---|---|
| Example 3-1 | 195 | 5 | 50 | poor |
| Example 3-2 | 246 | 5 | 50 | average |
| Example 3-3 | 390 | 5 | 50 | good |

Figure 17:
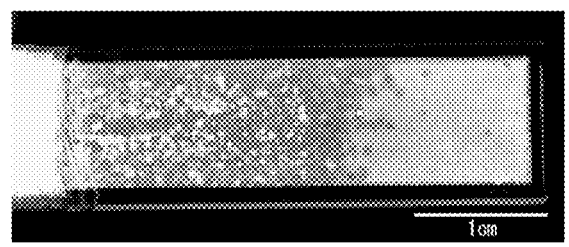
FIG. 17 is a photograph of colloidal crystals gelled in Example 3-3.
Figure 18:
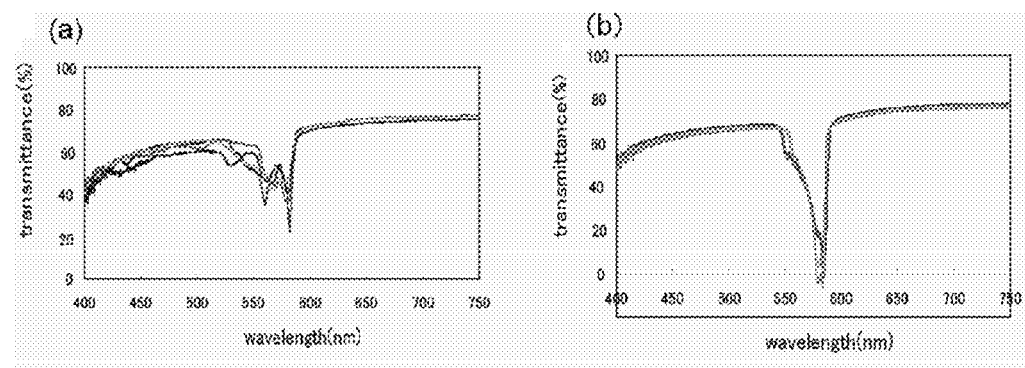
FIG. 18 is transmission spectra of a portion to which the zone melting process in Example 3-3 is not applied and a portion to which the zone melting process is applied.

A photograph of the gelled colloidal crystals of Example 3-3 is shown in FIG. 17. Herein, the colloidal polycrystals are recrystallized in a range between a right end and a position separated by 15 mm to the left from the right end by the zone melting process. An interference color mostly composed of a single color was recognized in the range. By contrast, colloidal polycrystals composed of various colors were recognized on a portion on which the colloidal polycrystals were not recrystallized by the zone melting process. Furthermore, the transmission spectra of the gelled colloidal crystals thus obtained were measured. As a result, as shown in FIG. 18, in the measurement result (a) of a portion to which the zone melting process was not applied, the portion had largely different spectra depending on measurement location. By contrast, in the measurement result (b) of a portion to which the zone melting process was applied, the almost even spectra were obtained. It was found that the application of the zone melting process promotes the single crystallization of the colloidal crystals.

The present invention is not limited to the description of the examples of the invention in any way. The present invention includes various modification aspects capable of being easily conceived by a person skilled in the art without departing from the description of Claims.

The invention claimed is:

1. A process for producing colloidal crystals, comprising:
   a preparation step of preparing a colloidal polycrystal dispersion in which colloidal polycrystals melt at a given temperature;
   an introduction step of introducing the colloidal polycrystal dispersion into a vessel; and
   a recrystallization step of recrystallizing the colloidal polycrystals, by setting a temperature of a partial area or a whole area of the colloidal polycrystal dispersion in the vessel to a temperature at which the colloidal crystals do not form and thereafter changing the temperature to a temperature at which the colloidal crystals form, wherein
   a weak acid or a weak base is added to the colloidal polycrystal dispersion,
   a degree of dissociation of the weak acid or the weak base changes depending on a change in temperature, and
   the colloidal crystals form depending on a change in pH caused by the change in temperature.

2. The process for producing colloidal crystals according to claim 1, wherein, in the recrystallization step, a temperature adjusting means sets a temperature of a part of the colloidal polycrystal dispersion to a temperature at which the colloidal crystals melt to form a melting area, and the colloidal polycrystals are recrystallized by a zone melting process for moving the melting area.

3. The process for producing colloidal crystals according to claim 2, wherein the melting area is moved by a moving means enabling relative movement between the temperature adjusting means and the vessel.

4. The process for producing colloidal crystals according to claim 1, wherein, in the introduction step, the colloidal polycrystal dispersion is filled between two walls facing each other approximately in parallel.

5. The process for producing colloidal crystals according to claim 1, wherein the colloidal particles of the colloidal polycrystal dispersion are silica particles, a dispersion medium is water, and the weak base is pyridine and/or a pyridine derivative.

6. The process for producing colloidal crystals according to claim 1, wherein the colloidal crystals are grown, and thereafter, the grown colloidal crystals are solidified by gelling.

7. The process for producing colloidal crystals according to claim 1, wherein, in the recrystallization step, a temperature adjusting means cools or heats the vessel from one end side of the vessel to melt the colloidal polycrystals in the colloidal polycrystal dispersion, and thereafter, cooling or heating caused by a temperature adjusting means is stopped to recrystallize the colloidal crystals.

* * * * *